United States Patent
Yokotsuka et al.

(10) Patent No.: US 8,168,742 B2
(45) Date of Patent: May 1, 2012

(54) CROSSLINKABLE FLUORINATED AROMATIC PREPOLYMER AND ITS USES

(75) Inventors: Shunsuke Yokotsuka, Yokohama (JP); Masahiro Ito, Yokohama (JP); Kaori Tsuruoka, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/631,123

(22) Filed: Dec. 4, 2009

(65) Prior Publication Data

US 2010/0144914 A1 Jun. 10, 2010

Related U.S. Application Data

(63) Continuation of application No. 11/392,727, filed on Mar. 30, 2006, now abandoned, which is a continuation of application No. PCT/JP2004/014200, filed on Sep. 29, 2004.

(30) Foreign Application Priority Data

Sep. 30, 2003 (JP) ................................. 2003-340031

(51) Int. Cl.
- C08G 65/38 (2006.01)
- C08G 63/78 (2006.01)
- C08G 61/10 (2006.01)
- H01L 21/02 (2006.01)
- H01L 21/70 (2006.01)

(52) U.S. Cl. .......... 528/86; 528/205; 528/212; 528/219; 528/397; 528/401; 524/611; 257/E21.264; 257/E21.576; 257/E21.581

(58) Field of Classification Search ................ 528/86, 528/205, 212, 219, 397, 401; 524/611; 257/E21.264, 576, 581
See application file for complete search history.

(56) References Cited

U.S. PATENT DOCUMENTS

| | | | |
|---|---|---|---|
| 5,115,082 A | 5/1992 | Mercer et al. | |
| 5,204,416 A | 4/1993 | Mercer et al. | |
| 5,959,157 A | 9/1999 | Lau et al. | |
| 5,986,045 A | 11/1999 | Lau et al. | |
| 6,881,811 B2 | 4/2005 | Yokotsuka et al. | |

FOREIGN PATENT DOCUMENTS

| | | |
|---|---|---|
| JP | 5-506042 | 9/1993 |
| JP | 10-247646 | 9/1998 |
| JP | 10-510580 | 10/1998 |
| JP | 3064011 | 5/2000 |
| JP | 2002-356551 | 12/2002 |
| JP | 2003-217343 | 7/2003 |
| WO | WO 03/008483 | 1/2003 |

OTHER PUBLICATIONS

Lee, et al., J. Polm. Sci., Part A, Polm. Chem. vol. 36, 2881 (1998).
U.S. Appl. No. 12/968,330, filed Dec. 15, 2010, Ito et al.

*Primary Examiner* — Duc Truong
(74) *Attorney, Agent, or Firm* — Oblon, Spivak, McClelland, Maier & Neustadt, L.L.P.

(57) ABSTRACT

To provide a crosslinkable fluorinated aromatic prepolymer which is capable of forming a cured product having a low relative permittivity, high heat resistance, low birefringence and high flexibility, and its uses.

A crosslinkable fluorinated aromatic prepolymer which is obtained by subjecting a compound (Y-1) having a crosslinkable functional group (A) and a phenolic hydroxyl group and/or a compound (Y-2) having a crosslinkable functional group (A) and a fluorinated aromatic ring, to a condensation reaction in the presence of a HF-removing agent, with a fluorinated aromatic compound (B) represented by the formula (1):

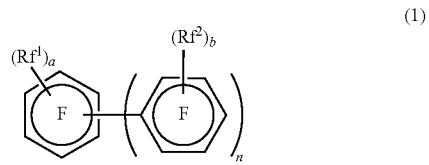

(wherein n is an integer of from 0 to 2, each of a and b which are independent of each other, is an integer of 0 to 3, and each of $Rf^1$ and $Rf^2$ represents a fluorinated alkyl group having at most 8 carbon atoms and a compound (C) having at least 3 phenolic hydroxyl groups, and which has crosslinkable functional groups (A) and ether bonds and has a number average molecular weight of from $1 \times 10^3$ to $5 \times 10^5$.

16 Claims, No Drawings

CROSSLINKABLE FLUORINATED AROMATIC PREPOLYMER AND ITS USES

CROSS-REFERENCE TO RELATED APPLICATIONS

This application is a continuation of U.S. Pat. No. 11/392,727 filed Mar. 30, 2006, abandoned, which was a continuation of PCT/JP4/14200 filed Sep. 29, 2004 and claims the benefit of JP2003-340031 filed Sep. 30, 2003.

TECHNICAL FIELD

The present invention relates to a crosslinkable aromatic prepolymer and its uses. A cured film formed by curing the crosslinkable fluorinated aromatic prepolymer of the present invention has a low relative permittivity, high heat resistance, low birefringence and high flexibility and thus is useful as an optical transmission device or an insulation film for electric or electronic components.

BACKGROUND ART

An insulation film having a lower relative permittivity is required, as electronic devices, multilayer wiring boards, etc. are increasingly small-sized and highly integrated, and as displays of e.g. TFT are large-sized and become high-resolution. Further, as an optical material to be used for an optical transmission device such as an optical integrated circuit, an optical switching device or an optical-electrical consolidated substrate, a material having high light transmittance and low birefringence (dependency on polarization of refractive index), is required. Fluorinated aromatic polymers are now being studied to satisfy such requirements and to secure heat resistance of at least 250° C., preferably at least 300° C., further preferably at least 350° C., which is required in the process for producing and/or mounting electronic devices, multilayer wiring boards or optical transmission devices.

As a fluorinated aromatic polymer, a fluorinated aromatic polymer having ether bonds (hereinafter referred to as a polyarylene ether or PAE) has been proposed (e.g. Patent Documents 1 to 3 and Non-Patent Document 1). Its relative permittivity is from about 2.5 to 2.9, and its application to an insulation film for electronic devices or multilayer wiring boards, is being studied. Further, its application to optical transmission devices is also being studied.

Further, PAE having a branched structure has been proposed which is produced by using a compound having at least three phenolic hydroxyl groups (e.g. Patent Document 4).

Further, PAE satisfying both a dielectric constant and high Tg has been proposed which is produced from a specific fluorinated aromatic compound having a branched structure (e.g. Patent Document 5).

Patent Document 1: Japanese Patent No. 3064011
Patent Document 2: U.S. Pat. No. 5,115,082
Patent Document 3: U.S. Pat. No. 5,959,157
Patent Document 4: JP-A-10-247646
Patent Document 5: WO03/008483
Non-Patent Document 1: J. Polm. Sci.; Part A; Polm. Chem., vol. 36, 2881 (1998)

DISCLOSURE OF THE INVENTION

Problems to be Solved by the Invention

However, the above-described prior art has had the following problems.

PAE disclosed in Patent Documents 1 to 3 and Non-Patent Document 1, is a linear-chain polymer produced by using a compound having two phenolic hydroxyl groups, and its glass transition temperature (hereinafter referred to as Tg) is low and the heat resistance is inadequate. Tg can be increased by introducing crosslinkable functional groups to PAE, followed by crosslinking, but the relative permittivity will thereby be increased to a level of from 2.7 to 3.0. Thus, it is difficult to satisfy both a low relative permittivity and high Tg. Further, the birefringence of such a polymer is about 0.007, which is low as compared with a polyimide or the like but is still inadequate as an optical transmission device.

Further, PAE having a branched structure as disclosed in Patent Document 4 has no crosslinkable functional group and thus is thermoplastic, whereby Tg can hardly be made to be at least 300° C.

Further, PAE produced from a specific fluorinated aromatic compound having a branched structure as disclosed in Patent Document 5 has a very bulky molecular structure and thus has a drawback that it is brittle and inferior in flexibility. Specifically, it has a drawback that particularly when a thick film is to be formed, cracking is likely to result in the coating film by a thermal stress.

The present invention has been made under the above-described circumstances, and it is an object of the present invention to provide a crosslinkable fluorinated aromatic prepolymer which is capable of forming a cured product having a low specific permittivity, high heat resistance, low birefringence and high flexibility simultaneously, a coating composition containing it, a cured product formed by using such a prepolymer, and a cured film formed from the coating composition.

Means to Solve the Problems

In order to accomplish the above object, the present invention provides a crosslinkable fluorinated aromatic prepolymer which is obtained by subjecting either one or both of a compound (Y-1) having a crosslinkable functional group (A) and a phenolic hydroxyl group and a compound (Y-2) having a crosslinkable functional group (A) and a fluorinated aromatic ring, to a condensation reaction in the presence of a HF-removing agent, with a fluorinated aromatic compound (B) represented by the following formula (1):

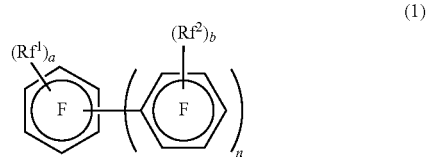

(wherein n is an integer of from 0 to 2, each of a and b which are independent of each other, is an integer of from 0 to 3, and each of $Rf^1$ and $Rf^2$ which may be the same or different from each other, represents a fluorinated alkyl group having at most 8 carbon atoms, and F in the aromatic ring represents that hydrogen atoms of the aromatic ring are all substituted by fluorine atoms), and a compound (C) having at least 3 phenolic hydroxyl groups, and which has crosslinkable functional groups (A) and ether bonds and has a number average molecular weight of from $1 \times 10^3$ to $5 \times 10^5$.

In the crosslinkable fluorinated aromatic prepolymer of the present invention, it is preferred that the crosslinkable functional group (A) is an ethynyl group.

Further, the present invention provides a cured product formed by curing the above crosslinkable fluorinated aromatic prepolymer.

Further, the present invention provides a coating composition comprising the above crosslinkable fluorinated aromatic prepolymer and a solvent.

Further, the present invention provides a cured film formed by forming a wet film of a crosslinkable fluorinated aromatic prepolymer on a substrate by using the above coating composition, and then, after removing the solvent in the wet film or at the same time as removing the solvent, curing the crosslinkable fluorinated aromatic prepolymer.

This cured film may contain pores in the film.

Further, the present invention provides an electric or electronic component having the above cured film.

EFFECTS OF THE INVENTION

The crosslinkable fluorinated aromatic prepolymer of the present invention is produced by using the compound (C) having at least three phenolic hydroxyl groups and has crosslinkable functional groups (A), whereby it is possible to form a cured film which satisfies a low dielectric constant, low birefringence and high heat resistance simultaneously.

Further, the crosslinkable fluorinated aromatic prepolymer of the present invention is capable of forming a cured film excellent in flexibility, whereby it is possible to obtain a film strong against an external force such as bending, and it becomes easy to form a thick film.

Further, the cured product formed by curing the crosslinkable fluorinated aromatic prepolymer of the present invention is excellent in applicability to insulation films for electronic devices and multilayer wiring boards, films and optical transmission devices. In such applications, it is possible to accomplish high performance in e.g. reduction of signal transmission delay time for an element and to gain high reliability by excellent mechanical properties in a high temperature region.

BEST MODE FOR CARRYING OUT THE INVENTION

The crosslinkable fluorinated aromatic prepolymer of the present invention (hereinafter referred to simply as the prepolymer) is characterized in that it is obtained by subjecting either one or both of a compound (Y-1) having a crosslinkable functional group (A) and a phenolic hydroxyl group and a compound (Y-2) having a crosslinkable functional group (A) and a fluorinated aromatic ring, to a condensation reaction in the presence of a HF-removing agent, with a fluorinated aromatic compound (B) represented by the following formula (1):

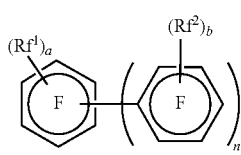

(1)

(wherein n is an integer of from 0 to 2, each of a and b which are independent of each other, is an integer of from 0 to 3, and each of $Rf^1$ and $Rf^2$ which may be the same or different from each other, represents a fluorinated alkyl group having at most 8 carbon atoms, and F in the aromatic ring represents that hydrogen atoms of the aromatic ring are all substituted by fluorine atoms), and a compound (C) having at least 3 phenolic hydroxyl groups, and it has crosslinkable functional groups (A) and ether bonds and has a number average molecular weight of from $1 \times 10^3$ to $5 \times 10^5$.

The prepolymer of the present invention is produced by using the compound (C) having at least three phenolic hydroxyl groups and has crosslinkable functional groups (A), whereby it is possible to obtain a cured product (a fluorinated aromatic polymer) satisfying a low dielectric constant, low birefringence and high heat resistance simultaneously. Namely, by using the compound (C) having at least three phenolic hydroxyl groups, it is possible to introduce branched structures to the polymer chain to make the molecular structure three dimensional thereby to increase the free volume of the polymer, whereby low densification i.e. a low dielectric constant can be accomplished. Further, usually, a linear chain polymer having aromatic rings is likely to undergo orientation of molecules due to stacking of aromatic rings, and the birefringence tends to increase. Whereas, with the cured product of the present invention, orientation of molecules is suppressed by the introduction of branched structures, and consequently, the birefringence will be small.

By the presence of the crosslinkable functional groups (A), in the obtainable cured product, a crosslinking or chain-extending reaction among prepolymer molecules can be promoted, and consequently, the heat resistance will be substantially be improved. At the same time, there is an effect such that the solvent resistance of the cured product will be improved.

Further, by the use of the fluorinated aromatic compound (B) represented by the above formula 1, it is possible to obtain a cured product having excellent flexibility. As compared with a fluorinated aromatic polymer produced from a fluorinated aromatic compound having a branched structure in itself, it is possible to increase the density of ether bonds, whereby flexibility of the main chain will be improved, and consequently, it is possible to obtain a cured product having excellent flexibility. The flexibility being excellent is advantageous particularly when the cured product is in the form of a cured film.

In the present invention, the fluorinated aromatic compound (B) is a fluorinated aromatic compound represented by the above formula (1). In this formula (1), each of $Rf^1$ and $Rf^2$ is a fluorinated alkyl group having at most 8 carbon atoms. From the viewpoint of the heat resistance, a perfluoroalkyl group is preferred. As a specific example, a perfluoromethyl group, a perfluoroethyl group, a perfluoropropyl group, a perfluorobutyl group, a perfluorohexyl group or a perfluorooctyl group may be mentioned.

If the number of $Rf^1$ or $Rf^2$ exceeds 2, it tends to be difficult to produce the fluorinated aromatic compound (B). Accordingly, the number (a or b) of $Rf^1$ or $Rf^2$ is independently preferably from 0 to 2, most preferably 0. The fluorinated aromatic compound (B) is preferably perfluorobenzene, perfluorotoluene, perfluoroxylene, perfluorobiphenyl or perfluoroterphenyl, particularly preferably perfluorobenzene or perfluorobiphenyl. These compounds may be used alone or in combination as a mixture of two or more of them. As the fluorinated aromatic compound (B), perfluorobiphenyl is most preferred, since the cured product thereby obtainable will be excellent in the balance of the dielectric constant and the heat resistance, and the flexibility of the cured product will be high.

In the present invention, the compound (C) having at least three, preferably from 3 to 5, phenolic hydroxyl groups is preferably a polyfunctional phenol. As a specific example, trihydroxybenzene, trihydroxybiphenyl, trihydroxynaphthalene, 1,1,1-tris(4-hydroxyphenyl)ethane, tris(4-hydroxyphenyl)benzene, tetrahydroxybenzene, tetrahydroxybiphenyl, tetrahydroxybinaphthyl or a tetrahydroxyspiroindan may, for example, be mentioned. As the compound (C), a compound having three phenolic hydroxyl groups, is preferred, since the flexibility of a cured film thereby obtainable will be high, and especially, trihydroxybenzene is most preferred, since the dielectric constant of a cured product thereby obtainable will be low.

The prepolymer of the present invention contains crosslinkable functional groups (A). Such crosslinkable functional groups (A) are reactive functional groups which do not substantially undergo a reaction during the production of the prepolymer and which undergo a reaction when an external energy is given at the time of preparing a cured product such as a coating, a film or a molded product or at an optional point of time after the preparation, to induce crosslinking or chain extension among prepolymer molecules.

As the external energy, heat, light, electron beams, etc. or a combination thereof is preferred in view of the excellent applicability to the production of electronic devices, multilayer wiring boards or optical transmission devices and/or to the mounting process. In a case where heat is employed as the external energy, reactive functional groups which react at a temperature of from 40° C. to 500° C. are preferred. If the reactive temperature is too low, the stability cannot be secured during the storage of the prepolymer or a coating composition containing the prepolymer, and if it is too high, the prepolymer itself tends to undergo heat decomposition during the reaction. Accordingly, the temperature for the reaction is preferably within the above range, more preferably from 60° C. to 400° C., most preferably from 70° C. to 350° C. In a case where light is employed as the external energy, it is also preferred to incorporate a photo radical initiator, a photo acid generator, a sensitizer, etc. to the prepolymer or to the aftermentioned coating composition containing the prepolymer. Further, crosslinkable functional groups (A) containing no polar groups will not increase the relative permittivity of a cured film, and it is preferred to employ crosslinkable functional groups (A) containing no polar groups, especially when the prepolymer of the present invention is employed for the production of an insulation film.

Specific examples of the crosslinkable functional groups (A) include, for example, vinyl groups, allyl groups, methacryloyl(oxy) groups acryloyl(oxy) groups, vinyloxy groups, trifluorovinyl groups, trifluorovinyloxy groups, ethynyl groups, 1-oxocyclopenta-2,5-diene-3-yl groups, cyano groups, akoxysilyl groups, diarylhydroxymethyl groups and hydroxyfluorenyl groups. Vinyl groups, methacryloyl(oxy) groups, acryloyl(oxy) groups, trifluorovinyloxy groups or ethynyl groups are preferably employed, since the reactivity is high, and a high crosslinking density can be obtained. Ethynyl groups are most preferred since a cured product thereby obtainable will have excellent heat resistance.

The content of the crosslinkable functional groups (A) in the prepolymer of the present invention is such that the crosslinkable functional groups (A) are preferably from 0.1 to 4 mmol, more preferably from 0.2 to 3 mmol, per gram of the prepolymer. If the content exceeds this range, brittleness of a cured product tends to increase, and the relative permittivity may sometimes increase. On the other hand, if it is smaller than this range, the heat resistance and the solvent resistance of the cured product may sometimes decrease.

The prepolymer of the present invention may be produced by either one or both of the following methods (i) and (ii).

(i) A method wherein the fluorinated aromatic compound (B) represented by the above formula 1, the compound (C) having at least three phenolic hydroxyl groups and the compound (Y-1) having a phenolic hydroxyl group are subjected to a condensation reaction in the presence of a HF-removing agent.

(ii) A method wherein the fluorinated aromatic compound (B), the compound (C) having at least three phenolic hydroxyl groups and the compound (Y-2) having a crosslinkable functional group (A) and a fluorinated aromatic ring are subjected to a condensation reaction in the presence of a HF-removing agent.

Further, in a case where the prepolymer is produced by both of the above (i) and (ii), the fluorinated aromatic compound (B), the compound (C), the compound (Y-1) and the compound (Y-2) are subjected to a condensation reaction in the presence of a HF-removing agent.

In the above methods for producing the prepolymer, the condensation reaction is considered to proceed as follows. As shown in the following formula (2), an ether bond will be formed by e.g. a reaction mechanism wherein a phenoxy group derived from a phenolic hydroxyl group will attack the carbon atom to which a fluorine atom of the fluorinated aromatic compound (B) is bonded, and then the fluorine atom will be detached. Further, in a case where the compound (C) and/or (Y-1) has two phenolic hydroxyl groups present at an ortho position to each other, a dioxin skeleton may be formed as shown by the following formula (3) by e.g. a similar reaction mechanism.

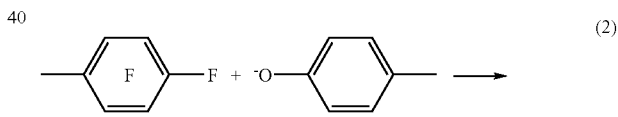

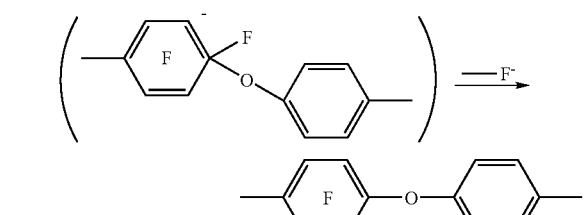

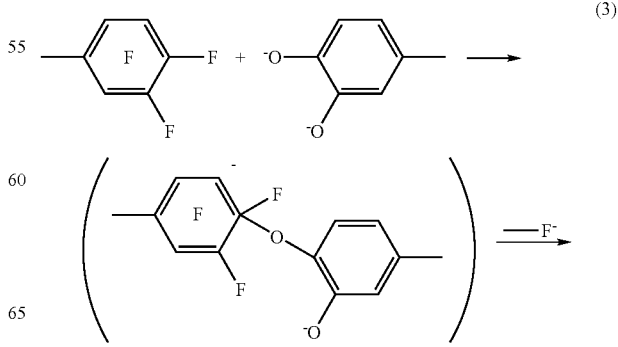

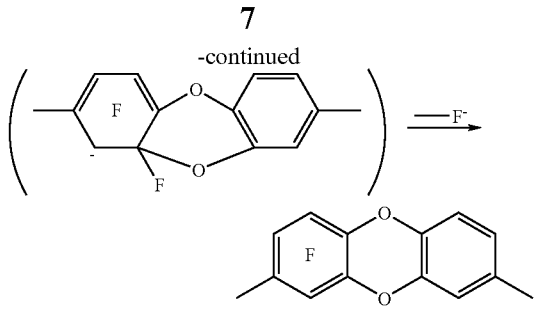

As the compound (Y-1) having a crosslinkable functional group (A) and a phenolic hydroxyl group to be used in the process (i), a compound (Y-1-1) having one phenolic hydroxyl group and a compound (Y-1-2) having two phenolic hydroxyl groups, are preferred.

Specific examples of the compound (Y-1-1) having a crosslinkable functional group (A) and one phenolic hydroxyl group include a phenol having a reactive double bond such as 4-hydroxystyrene and an ethynyl phenol such as 3-ethynyl phenol, 4-phenylethynyl phenol or 4-(4-fluorophenyl)ethynyl phenol. They may be used alone or in combination as a mixture of two or more of them. More preferred is an aromatic compound having an ethynyl group as the crosslinkable functional group (A).

Specific examples of the compound (Y-1-2) having a crosslinkable functional group (A) and two phenolic hydroxyl groups include a bis(phenylethynyl)dihydroxybiphenyl such as 2,2'-bis(phenylethynyl)-5,5'-dihydroxybiphenyl or 2,2'-bis(phenylethynyl)-4,4'-dihydroxybiphenyl, and a dihydroxydiphenylacetylene such as 4,4'-dihydroxytolan or 3,3'-dihydroxytolan. They may be used alone or in combination as a mixture of two or more of them.

As the compound (Y-2) having a crosslinkable functional group (A) and a fluorinated aromatic ring to be used in the method (ii), a compound having a crosslinkable functional group (A) and a perfluoro aromatic ring such as perfluorophenyl or perfluorobiphenyl, is preferred. Its specific examples include a fluorinated aryl having a reactive double bond, such as pentafluorostyrene, pentafluorobenzyl acrylate, pentafluorobenzyl methacrylate, pentafluorophenyl acrylate, pentafluorophenyl methacrylate, perfluorostyrene, pentafluorophenyltrifluorovinyl ether or 3-(pentafluorophenyl)pentafluoropropene-1, a fluorinated aryl having a cyano group, such as pentafluorobenzonitrile, a fluorinated aryl acetylene such as pentafluorophenyl acetylene or nonafluorobiphenyl acetylene, and a fluorinated diaryl acetylene such as phenylethynyl pentafluorobenzene, phenylethynyl nonafluorobiphenyl or decafluorotolan. They may be used alone or in combination as a mixture of two or more of them. As the compound (Y-2), a fluorinated arylacetylene is preferred, since the crosslinking reaction will thereby proceed at a relatively low temperature, and the heat resistance of a prepolymer cured product thereby obtained will be high.

As the HF-removing agent to be used for the production of the prepolymer of the present invention, a basic compound is preferred, and an alkali metal carbonate, hydrogen carbonate or hydroxide is particularly preferred. Specific examples include sodium carbonate, potassium carbonate, sodium hydrogen carbonate, potassium hydrogen carbonate, sodium hydroxide or potassium hydroxide.

With respect to the amount of the HF-removing agent to be used, in the method (i), it is required in an amount of at least equimolar, preferably from 1.1 to 3 times in a molar ratio to the total molar amount of phenolic hydroxyl groups in the compound (C) and the compound (Y-1). In the method (ii), it is required in an amount of at least equimolar, preferably from 1.1 to 3 times in a molar ratio to the molar amount of phenolic hydroxyl groups in the compound (C).

In the methods (i) and (ii), the condensation reaction is preferably carried out in a polar solvent. The polar solvent is preferably a solvent containing an aprotic polar solvent such as N,N-dimethylacetamide, N,N-dimethylformamide, N-methylpyrrolidone, dimethyl sulfoxide or sulfolane. To the polar solvent, toluene, xylene, benzene, tetrahydrofuran, benzotrifluoride, xylenehexafluoride or the like may be incorporated within a range not to deteriorate the solubility of the prepolymer to be formed or not to adversely affect the condensation reaction. By such incorporation, the polarity (the dielectric constant) of the solvent may be changed to control the reaction rate.

The condensation reaction conditions are preferably from 10 to 200° C. for from 1 to 80 hours, more preferably from 20 to 180° C. for from 2 to 60 hours, most preferably from 50 to 160° C. for from 3 to 24 hours.

The number average molecular weight of the prepolymer of the present invention is within a range of from $1 \times 10^3$ to $5 \times 10^5$, preferably from $1.5 \times 10^3$ to $1 \times 10^5$. When it is within a range of from $1 \times 10^3$ to $5 \times 10^5$, the coating properties of the after-mentioned coating composition containing such a prepolymer will be good, and the resulting cured film will have good heat resistance, mechanical properties, solvent resistance, etc. In an application to an insulation film for electronic devices, when a property to sufficiently penetrate into fine spaces of a substrate and to make the surface smooth (so-called gap-filling and planarization property) is required, the number average molecular weight of the prepolymer is most preferably within a range of from $1.5 \times 10^3$ to $5 \times 10^4$.

The number average molecular weight of the prepolymer can be controlled by changing the charging ratio of the fluorinated aromatic compound (B) to the sum of the compound (C) and the compound (Y-1) in the method (i). Here, it is preferred that no hydroxyl groups will remain in the prepolymer, since the relative permittivity will thereby be low. In the condensation reaction in the present invention, the fluorinated aromatic compound (B) usually functions as a bifunctional compound. Accordingly, control of the molecular weight is preferably adjusted within a range where the total molar amount of hydroxyl groups in the compound (C) and the compound (Y-1) will not exceed twice of the molar amount of the fluorinated aromatic compound (B).

Likewise, in the method (ii), the number average molecular weight of the prepolymer can be controlled by changing the charging ratio of the compound (C) to the sum of the fluorinated aromatic compound (B) and the compound (Y-2). Also here, in the same manner as mentioned above, control of the molecular weight is preferably adjusted within a range wherein the total molar amount of hydroxyl groups will not exceed the sum of, the molar amount of the compound (Y-2) and twice the molar amount of the fluorinated aromatic compound (B), when the compound (Y-2) serves as a monofunctional compound. Further, when the compound (Y-2) serves as a bifunctional compound, it is preferably adjusted within a range wherein the total molar amount of hydroxyl groups will not exceed twice the total molar amount of the fluorinated aromatic compound (B) and the compound (Y-2).

Further, in the method (ii), in a case where the reaction rates of the fluorinated aromatic compound (B) and the compound (Y-2) are different, the molecular weight for composition of the prepolymer thereby obtainable may sometimes be different depending upon the order of addition. For example, in a case where the reaction rates to phenoxy groups derived from the phenolic hydroxyl group of the compound (C) are (B)>

(Y-2), if the fluorinated aromatic compound (B) and the compound (Y-2) are charged simultaneously, all phenoxy groups may be consumed by the fluorinated aromatic compound (B) before all the compound (Y-2) is consumed, whereby a non-reacted compound (Y-2) may remain. In such a case, in order to increase the reaction rate of the compound (Y-2), it is preferred that after charging the compound (Y-2) first, the fluorinated aromatic compound (B) is charged. However, in such a method, variation in the composition of the resulting prepolymer chains tends to be large. When it is required to minimize such variation in the composition of the resulting prepolymer chains, it is preferred to carry out the production by charging all at once.

In the method (i), the amount of the compound (C) to be used is preferably from 0.1 to 1 time, more preferably from 0.3 to 0.6 time, in a molar ratio to the fluorinated aromatic compound (B), and the amount of the compound (Y-1) to be used is preferably from 0.1 to 2 times, more preferably from 0.2 to 1.5 times, in a molar ratio to the fluorinated aromatic compound (B). In the method (ii), the amount of the compound (C) to be used is preferably from 0.5 to 2 times, more preferably from 0.6 to 1.5 times, in a molar ratio to the fluorinated aromatic compound (B), and the amount of the compound (Y-2) is preferably from 0.1 to 2 times, more preferably from 0.2 to 1.5 times, in a molar ratio to the fluorinated aromatic compound (B). When the respective values are in such ranges, the resulting prepolymer will have a low dielectric constant and high heat resistance, such being desirable.

The prepolymer of the present invention may be produced by suitably selecting the method (i) or (ii) to obtain a prepolymer capable of obtaining a cured product having desired physical properties, depending upon the physical properties such as the heat resistance, relative permittivity, birefringence, and flexibility, of the cured product obtainable after the curing. For example, in a case where the method (ii) is used, the relative permittivity and birefringence values of a cured product obtainable by curing the prepolymer thus produced usually tend to be low. Accordingly, to obtain a cured product having low relative permittivity and birefringence values, it is preferred to produce the prepolymer by the method (ii).

In the present invention, in a case where the heat resistance of a cured product of the prepolymer is inadequate or the coating or film made of the cured product is brittle, a co-condensation component may be incorporated at the time of the production of the prepolymer to improve the heat resistance or flexibility of the cured product.

Such a co-condensation component may, for example, be a compound (Z) having two phenolic hydroxyl groups other than (Y-1) in order to improve the flexibility of the cured film, or a fluorinated aromatic compound (X) having a branched structure in order to improve the heat resistance of the cured film.

The compound (Z) having two phenolic hydroxyl groups may be a bifunctional phenol such as dihydroxybenzene, dihydroxybiphenyl, dihydroxyterphenyl, dihydroxyonaphthalene, dihydroxyanthracene, dihydroxyphenanthracene, dihydroxy-9,9-diphenylfluororene, dihydroxydibenzofuran, dihydroxydiphenyl ether, dihydroxydiphenyl thioether, dihydroxybenzophenone, dihydroxy-2,2-diphenylpropane, dihydroxy-2,2-diphenylhexafluoropropane or dihydroxybinaphthyl. They may be used alone or in combination as a mixture of two or more of them.

The fluorinated aromatic compound (X) having a branched structure may be perfluoro(1,3,5-triphenylbenzene) (the following formula (4A)) or perfluoro(1,2,4-triphenylbenzene) (the following formula (4B)).

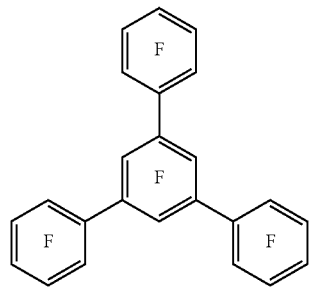

(4A)

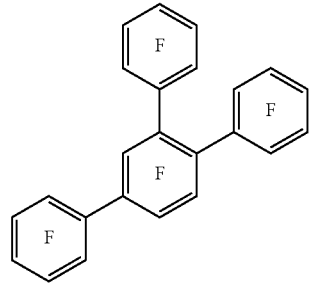

(4B)

After the condensation reaction or after formed into a solution, the prepolymer of the present invention is purified by a method such as neutralization, reprecipitation, extraction or filtration. The purification is preferably carried out in a state where the polar solvent preferably used during the production, is present, or in a state as dissolved or dispersed in the after-mentioned solvent, since the efficiency is thereby good. In an application as an insulation film for electronic devices or an insulation film for multilayer wiring boards, a metal such as potassium or sodium as a condensation reaction catalyst and free halogen atoms are likely to cause operation failure of a transistor or corrosion of wiring, and accordingly, it is preferred to sufficiently carry out the purification.

For the prepolymer of the present invention, various catalysts or additives may be employed for the purpose of e.g. increasing the reaction rate or reducing reaction defects during the crosslinking reaction for curing.

In a case where the prepolymer of the present invention contains ethynyl groups as the crosslinkable functional groups (A), the catalyst may, for example, be an amine such as aniline, triethylamine, aminophenyltrialkoxysilane or aminopropyltrialkoxysilane, or an organic metal compound containing molybdenum, nickel or the like.

As an additive to be added to the prepolymer, a biscyclopentadienone derivative is preferred. An ethynyl group and a cyclopentadienone group (a 1-oxocyclopenta-2,5-dien-3-yl group) undergoes a Diels-Alder reaction by heat to form an adduct, followed by a de-carbon monoxide reaction to form an aromatic ring. Accordingly, if a biscyclopentadienone derivative is used, crosslinking or chain extension can be carried out wherein an aromatic ring constitutes a linkage moiety.

Specific examples of the biscyclopentadienone derivative include 1,4-bis(1-oxo-2,4,5-triphenyl-cyclopenta-2,5-dien-3-yl)benzene, 4,4'-bis(1-oxo-2,4,5-triphenyl-cyclopenta-2,5-dien-3-yl)biphenyl, 4,4'-bis(1-oxo-2,4,5-triphenyl-cyclopenta-2,5-dien-3-yl)1,1'-oxybisbenzene, 4,4'-bis(1-oxo-2,4,5-triphenyl-cyclopenta-2,5-dien-3-yl)1,1'-thiobisbenzene, 1,4-bis(1-oxo-2,5-di-[4-fluorophenyl]-4-phenyl-cyclopenta-2,5-dien-3-yl)benzene, 4,4'-bis(1-oxo-2,4,5-triphenyl-cyclopenta-2,5-dien-3-yl)1,1'-(1,2-ethanediyl)bisbenzene and 4,4'-bis(1-oxo-2,4,5-triphenyl-cyclopenta-2,5-dien-3-yl)1, 1'-(1,3-propanediyl)bisbenzene.

Among these biscyclopentadienone derivatives, biscyclopentadienone derivatives having entirely aromatic skeletons are preferred from the viewpoint of the heat resistance. They may be used alone or in combination as a mixture of two or more of them.

From the prepolymer of the present invention, a cured product can be obtained by having its cross-linking reaction proceeded to cure it. The present invention provides a cured product by curing such a prepolymer. The cured product may have any shape. It is preferably a cured coating (a cured film) formed from a coating composition containing the after-mentioned solvent. In the following description, the present invention will be described in detail with reference to a cured film as a preferred form.

The prepolymer of the present invention can be used suitably as a material for a coating composition to be used for coating on a suitable substrate and forming a film by having its condensation reaction proceeded to cure it. Thus, the present invention provides a coating composition comprising the above prepolymer and a solvent.

The coating composition of the present invention can be obtained, for example, by dissolving or dispersing the above-mentioned prepolymer of the present invention in a solvent.

The solvent to be used for the coating composition of the present invention is not particularly limited so long as the prepolymer of the present invention and a catalyst or additives which may be added as the case requires, can be dissolved or dispersed therein, and a cured film having a desired thickness, uniformity or gap-filling and planarization property, can be obtained. For example, an aromatic hydrocarbon, a dipolar aprotic solvent, a ketone, an ester, an ether or a halogenated hydrocarbon may be mentioned. The solvent for the coating composition may be the same or different from the solvent for the reaction for the production of the above-described prepolymer. If a different solvent is to be used, the prepolymer may once be recovered from the reaction solution by e.g. a reprecipitation method and then dissolved or dispersed in a different solvent, or solvent substitution may be carried out by using a known method such as an evaporation method or an ultrafiltration method.

The aromatic hydrocarbon may, for example, be benzene, toluene, xylene, ethylbenzene, cumene, mesitylene, tetralin or methylnaphthalene.

The dipolar aprotic solvent may, for example, be N-methylpyrrolidone, N,N-dimethylformamide, N,N-dimethylacetamide, γ-butylolactone or dimethylsulfoxide.

The ketone may, for example, be cyclopentanone, cyclohexanone, cycloheptanone, cyclooctanone or ethyl amyl ketone.

The ether may, for example, be tetrahydrofuran, pyran, dioxane, dimethoxyethane, diethoxyethane, diphenyl ether, anisole, phenetole, diglyme or triglyme.

The ester may, for example, be ethyl lactate, methyl benzoate, ethyl benzoate, butyl benzoate, benzyl benzoate, methyl cellsolve acetate, ethyl cellsolve acetate, propylene glycol monomethyl ether, propylene glycol monoethyl ether, propylene glycol monopropyl ether, propylene glycol monobutyl ether or propylene glycol monoethyl ether acetate.

The halogenated hydrocarbon may, for example, be carbon tetrachloride, chloroform, methylene chloride, tetrachloroethylene, chlorobenzene or dichlorobenzene.

With respect to the coating composition of the present invention, the concentration of the prepolymer in the composition is preferably from 1 to 50 mass %, more preferably from 5 to 30 mass %. This coating composition may contain, in addition to the prepolymer and the solvent, at least one type of additives selected from various additives well known in the coating field such as plasticizers and thickeners. Further, to form a film or coating having pores, the after-mentioned hollow bodies or a material which can be removed after forming a thin film may, for example, be suitably incorporated.

In a case where the prepolymer of the present invention contains a low molecular weight substance having a vapor pressure, to prevent its evaporation during the heating, a part of the crosslinkable functional groups (A) may preliminarily be reacted in a solution. As such a method, heating is preferred. The heating conditions are preferably from 50° C. to 250° C. for from 1 to 50 hours, more preferably from 70 to 200° C. for from 1 to 20 hours. The reaction ratio in the solution of the crosslinkable functional groups is preferably less than 50%, more preferably less than 30%, with a view to preventing gellation of the prepolymer in the solution.

The coating composition of the present invention is applied on a suitable substrate surface to form a wet film, and then, after or at the same time as removing the solvent by e.g. evaporation, curing treatment is applied to let the crosslinkable functional groups (A) in the prepolymer undergo a crosslinking reaction to form a cured film which is applicable as an insulation film and an optical transmission device. As such a method for forming the wet film, it is preferred to employ a coating method. For example, a known coating method such as a spin coating method, a dip coating method, a spray coating method, a die-coating method, a bar coating method, a doctor coating method, an extrusion coating method, a scan coating method, a brush coating method or a potting method may be mentioned. In a case where it is used as an insulation film for electronic devices, a spin coating method or a scanning coating method is preferred from the viewpoint of uniformity of the film thickness.

After applying this coating composition, heating is carried out to evaporate the solvent and to cure the prepolymer by a crosslinking or chain extension reaction. The crosslinkable functional groups (A) of this prepolymer do not substantially react in a solution and will undergo a crosslinking reaction in the heating step after the film formation. The heating conditions are preferably from 200 to 450° C. for from about 1 to 120 minutes, more preferably from 250 to 400° C. for from about 2 to 60 minutes.

The heating equipment is preferably a hot plate, an oven or a furnace. The heating atmosphere may, for example, be an atmosphere of an inert gas such as nitrogen or argon, air, oxygen or reduced pressure. The heating atmosphere is preferably an inert gas atmosphere or a reduced pressure atmosphere. In order to secure the surface smoothness of the thin film or to improve fine space gap-filling properties of the thin film, it is preferred to add a preliminary heating step at a temperature of from about 50 to 250° C. or to carry out the heating step as divided into a plurality of stages. The reaction ratio of the crosslinkable functional groups (A) in the cured film is preferably from 30 to 100%. When the reaction ratio is at least 30%, the heat resistance and chemical resistance of the cured film will be good. From such a viewpoint, the reaction ratio is more preferably at least 50%, most preferably at least 70%.

The thickness of the wet film to be formed by the coating composition can be optionally set to match the shape of the desired cured film to be produced. For example, for the purpose of producing an insulation layer or film, it is preferred to form a wet film having a thickness of from about 0.01 to 500 μm on a substrate, and a thickness of from 0.1 to 300 μm is more preferred.

The cured film obtainable from the coating composition of the present invention may be peeled from the substrate and used as a film itself, or may be used as an insulation film or the like in a state as bonded on the substrate. In the latter case, in order to improve the adhesion between the cured film and the substrate, the adhesion promoter may be used. As such an adhesion promoter, a silane coupling agent, a titanate coupling agent or an aluminum coupling agent may be mentioned, and particularly preferred is a silane coupling agent such as an epoxysilane or an aminosilane. The aminosilane may, for example, be an aliphatic aminosilane such as 3-aminopropylmethyldiethoxysilane or 3-aminopropyltriethoxysilane, or an aromatic group-containing aminosilane such as aminophenyltrimethoxysilane, aminophenyltriethoxysilane or N-phenyl-3-aminopropyltrimethoxysilane.

As a method for applying the adhesion promoter, it is preferred to employ a method of treating the substrate with the adhesion promoter prior to coating with the coating composition, or a method of adding the adhesion promoter to the coating composition. As the method of treating the substrate with the adhesion promoter, in the case of an aminosilane, a method of spin-coating the substrate in the form of a 0.01 to 3 mass % solution in an alcohol. As such an alcohol, methanol, ethanol or isopropyl alcohol is preferred. In the method of adding the adhesion promoter in the prepolymer solution, the amount of the adhesive promoter to be added is preferably from 0.05 to 10 mass %, more preferably from 0.1 to 5 mass %, based on the contained prepolymer. If the amount of the adhesion promoter to be added is small, the effect for improving the adhesion tends to be inadequate, and if it is too large, the electrical properties or heat resistance tends to decrease.

The cured product produced by using the prepolymer of the present invention may be used for e.g. protective films, film materials for various cells such as fuel cells, photoresists, optical waveguides, non-linear optical materials, optical adhesives, covering materials, electronic components, encapsulation materials, over coating agents, transparent film materials, heat resistance/low moisture absorbing film materials, adhesives, fiber materials, weather resistant coating materials, water repellents, oil repellents, moisture proof coating agents, or non-sticky coating agents. Particularly preferred is an application to insulation films for electronic devices or multilayer wiring boards, films or optical transmission devices. The present invention provides an electric or electronic component having the cured film formed by using the coating composition comprising the above prepolymer and a solvent.

Among electric or electronic components which the cured film of the present invention is applicable, as electronic devices, a discreet semiconductor such as a diode, a transistor, a compound semiconductor, a thermistor, a varistor or a thyristor, a memory device such as DRAM (dynamic random access memory), SRAM (static random access memory), EPROM (erasable programmable read only memory), mask ROM (mask read only memory), EEPROM (electrical erasable programmable read only memory) or a flash memory, a logic device such as a microprocessor, DSP or ASIC, an integrated circuit device such as a compound semiconductor represented by MMIC (monolithic microwave integrated circuit), a hybrid integrated circuit (hybrid IC), a photoelectric conversion device such as a light emitting diode or a charge-coupled device, and a display device such as an amorphous silicon TFT (thin film transistor) or a polysilicon TFT, may, for example, be mentioned.

Among the electric or electronic components to which the insulation film of the present invention is applicable, the multilayer wiring boards may be various substrates to mount electronic devices, etc. thereon and may, for example, be high density wiring boards such as a printed circuit board, a buildup wiring board, a MCM substrate and an interposer.

As an insulation film in such electric or electronic components, a buffer coating film, a passivation film, an interlayer insulation film, an insulation film for redistribution or an alpha ray shielding film may, for example, be mentioned.

The optical transmission device is meant for a component which has a function to let light pass therethrough for transmission, branching, amplification or optical branching/multiplexing. The optical transmission device may, for example, be an optical fiber, a rod lens, an optical waveguide, an optical branching device, an optical multiplexer, an optical branching filter, an optical attenuator, an optical switch, an optical isolator, an optical transmitter module, an optical receiver module, a coupler, a deflector, a light wavelength conversion device, a light modulation device, an optical integrated circuit, a photoelectric hybrid circuit or a substrate itself or an optical transmission portion thereof.

The wavelength of light to be used for the optical transmission device is preferably within a range of from 600 to 1,600 nm. Within such a range, 650 nm band, 850 nm band, 1,300 nm band or 1,550 nm band is preferred, since a component for e.g. a laser is thereby readily available.

In a case where the above optical transmission device is used as a so-called electro-optic (EO) material to modulate and control optical transmission by an external electric field to carry out phase change, directional coupling, mode conversion or change of the course of guided light, it is preferred to have a non-linear optical dye doped. As such a non-linear optical dye, a compound having a long n-conjugated system and having a push-pull type electron structure having an electron donating group and an electron attracting group, is preferred. As a specific example, an azobenzene dye or a polyene dye may, for example, be mentioned.

In an application to an insulation film for electronic devices or an insulation film for multilayer wiring boards employing the cured film formed from the prepolymer of the present invention, in order to obtain an insulation film having a lower relative permittivity, it is preferred to provide pores in the insulation film of the present invention. As a method for introducing such pores, the following method (a) or (b) may, for example, be mentioned.

(a) A method wherein the coating composition of the present invention, the prepolymer of the present invention and a polymer having a low heat decomposition temperature (hereinafter referred to as a heat-decomposable polymer) are complexed, and at the time of forming an insulation film, the heat decomposable polymer portion is removed.

(b) A method wherein fine particles are added into the coating composition of the present invention, and the fine particle portions are removed during or after forming the insulation film.

In the method (a), the heat decomposable polymer may, for example, be an aliphatic polyether, an aliphatic polyester, an acrylic polymer or a styrene polymer. The number average molecular weight of the heat decomposable polymer is preferably from 1,000 to 100,000, more preferably from 1,000 to 50,000. When the molecular weight is within this range, the compatibility with the prepolymer of the present invention can be secured in the coating composition, such being desirable. As a method for complexing the prepolymer of the present invention and the heat decomposable polymer, a method may, for example, be mentioned wherein a coating composition comprising a prepolymer and the heat decomposable polymer will be prepared and applied on a substrate, and then, the solvent is evaporated and heat treatment is carried out to obtain a composite film, or a method wherein the prepolymer and the heat decomposable polymer are complexed by blocking or grafting, and the composite thereby obtained is incorporated to the coating composition. As the method for blocking or grafting, a known method may be employed. For example, a method may be mentioned wherein a heat decomposable polymer having a fluorinated aromatic ring or a phenolic hydroxyl ring at its terminal, is prepared, and it is co-condensed at the time of the condensation reaction for the preparation of the prepolymer. The condensation reaction for the prepolymer will proceed by the reaction mechanism of the above formula (2) or (3), whereby the terminal fluorinated aromatic ring or phenolic hydroxyl group moiety will be bonded to the prepolymer chain. Here, in a case where the heat decomposable polymer has a fluorinated aromatic ring or phenolic hydroxyl group at one terminal, it is possible to obtain a prepolymer having the heat decomposable polymer grafted. In a case where the heat decomposable polymer has a fluorinated aromatic ring or phenolic hydroxyl group at each terminal, it is possible to obtain a block product of the prepolymer and the heat decomposable polymer.

The heat decomposable polymer has a low heat decomposition temperature, and by the heating during the formation of an insulation film, it is selectively decomposed and removed, and the removed portions will be pores. It is possible to control the porosity by the amount of the heat decomposable polymer added to the coating composition, and the amount of the heat decomposable polymer to be added, is usually preferably form 5 to 80 vol %, more preferably from 10 to 70 vol %, based on the prepolymer.

In the method (b), the fine particles to be dispersed in the coating composition of the present invention are preferably inorganic fine particles. As such inorganic fine particles, fine particles of silica, metal, etc. may be mentioned. The fine particles will be dissolved and removed by e.g. acid treatment after the film-forming, so that the removed portions will be pores. It is possible to control the porosity by the amount of the fine particles to be added. The amount of the fine particles to be added is usually preferably from 5 to 80 vol %, more preferably from 10 to 70 vol %, based on the prepolymer.

The insulation film of the present invention may also be preferably be complexed with another film. For example, in a case where it is used as a passivation film for a semiconductor device or as an interlayer insulation film for a semiconductor device, it is preferred to form an inorganic film as a lower layer and/or upper layer of the insulation film of the present invention.

The inorganic film may be formed by a normal pressure, reduced pressure or plasma chemical vapor deposition (CVD) method or a coating method and may, for example, be phosphorus and/or boron doped, as the case requires, silicon oxide film so-called PSG film or BPSG film, a silicon oxide film, a silicon nitride film, a silicon oxide nitride film, a SiOC film, or a spin-on-glass (SOG) film.

By forming an inorganic film between the metal wiring and the insulation film of the present invention, it is possible to obtain effects to prevent peeling of the metal wiring and to facilitate etching for e.g. a damascene structure. It is preferred to form the inorganic film on the insulation film after partially removing the insulation film of the present invention by an etch back process or CMP (chemical mechanical polishing) process.

In a case where the adhesion between the insulation film and the inorganic film is inadequate when the inorganic film is formed on the insulation film of the present invention or film reduction takes place at the time of forming the inorganic film, it is preferred to apply the following method (I) or (II).

(I) A method of forming a multilayer inorganic film: In a case where a silicon oxide film is formed by a plasma CVD process, film reduction may occur depending upon the gas composition to be used. In such a case, firstly, a thin inorganic film which undergoes no film reduction (such as a silicon nitride film or a normal pressure CVD-silicon oxide film, is formed. Then, using this thin film as a barrier layer, a silicon oxide layer is formed.

(II) A method of treating the insulation film of the present invention with energy rays: There is a case where the interface adhesion in the inorganic film and the insulation film of the present invention can be improved by treatment with energy rays. Such energy ray treatment may, for example, be treatment by means of electromagnetic waves in a broad sense including light, such as ultraviolet irradiation, laser irradiation or microwave irradiation, or treatment by means of electron rays such as electron irradiation, glow discharge treatment, corona discharge treatment or plasma treatment.

Among them, as a treating method suitable for a mass production process for semiconductor devices, UV irradiation, laser irradiation, corona discharge treatment or plasma treatment may be mentioned.

Plasma treatment is more preferred since a damage to semiconductor device is thereby little. The apparatus for the plasma treatment is not particularly limited so long as a desired gas can be introduced into the apparatus and an electric field can be applied, and a commercially available barrel type or parallel flat plate type plasma generating apparatus may suitably be used. The gas to be introduced into the plasma apparatus is not particularly limited so long as it is capable of effectively activate the surface, and argon, helium, nitrogen, oxygen or a mixed gas thereof may, for example, be mentioned. Further, as a gas which is capable of activating the surface of the cured film for the prepolymer and which brings about substantially no film reduction, a mixed gas of nitrogen and oxygen, or a nitrogen gas may be mentioned.

EXAMPLES

The present invention will be described in further detail with reference to the following Examples and Comparative Examples. However, the present invention is by no means thereby restricted. Among the following Examples, Examples 1 to 6 and 10 to 14 are Examples of the present invention, and Examples 7 to 9 are Comparative Examples. Examples 1 to 9 are directed to preparation of a prepolymer for evaluation of the basic properties of a cured film; Example 10 is directed to evaluation of the adhesive property of the cured film; Example 11 is directed to preparation of pore-introduced cured film; Example 12 is directed to evaluation of the properties of an insulation film; Example 13 is directed to preparation of a film and evaluation of its properties; and Example 14 is directed to preparation of a prepolymer employing both (Y-1) and (Y-2). Further, as the basic properties of the prepolymer in each of Examples 1 to 9 and the cured film made of the prepolymer, the respective items of the molecular weight, the relative permittivity, the birefringence Tg and the thick film-forming property were measured by the following methods.

Molecular Weight

A vacuum dried prepolymer was subjected to a gel permeation chromatography method (GPC) to obtain a number average molecular weight calculated as polystyrene. Tetrahydrofuran was used as the carrier solvent.

Relative Permittivity

A vacuum dried prepolymer powder was dissolved in cyclohexanone to obtain a 20% solution, which was filtered through a PTFE filter having a pore diameter of 0.5 µm. Using the obtained solution, a cured film having a thickness of about 1 µm was formed by a spin coating method on a 4 inch silicon wafer. The spinning conditions were 1,000 to 3,000 rpm for 30 seconds, and after preheating by a hot plate at 100° C. for 90 seconds and 200° C. for 90 seconds, heating was carried out in a nitrogen atmosphere in a vertical furnace at 350° C. for two hours. Then, a CV measurement was carried out by a mercury prober (SSM-495, manufactured by SSM) to obtain a relative permittivity at 1 MHz. As the thickness of the cured film, a value obtained by a spectroellipsometer was used.

Birefringence

By the same method as described above, a cured film having a thickness of from 2 to 5 µm was formed on a quartz substrate to prepare a slab optical waveguide. The heating conditions were 300° C. for one hour. By a prism coupler (model 2010) manufactured by Metricon Corporation, refractive indices against the polarized light in a perpendicular direction and the polarized light in a horizontal direction to the film surface, were, respectively measured, and their difference was obtained. Here, the measurement was carried out at a wavelength of light being 1,550 nm.

Tg

The above-mentioned 20% prepolymer solution in cyclohexanone obtained by filtration was dropped on a silicon wafer, and after preheating at 200° C. for 300 seconds by a hot plate, heating was carried out in a nitrogen atmosphere at 350° C. for one hour in a vertical furnace to obtain a cured film. The film was scraped off from the silicon wafer, and DSC measurement was carried out to obtain Tg. In the DSC measurement, scanning was carried out in a nitrogen atmosphere of from 40° C. to 400° C. under a condition of a temperature raising rate of 10° C./min.

Thick Film-Forming Property

A vacuum dried prepolymer powder was dissolved in cyclohexanone to obtain a 40% solution, which was spin-coated on a silicon wafer, followed by heating at 250° C. for 180 seconds by a hot plate to form a cured film having a thickness of about 10 µm. The presence or absence of defects in the cured film was evaluated by visual inspection and observation by metallographic microscope.

Example 1

Preparation of Prepolymer by the Method (i) Using Compounds (B), (C) and (Y-1)

Into a 100 mL pyrex (registered trademark) four-necked flask equipped with a Dimroth condenser, a thermocouple thermometer and a mechanical stirrer, 2.67 g of perfluorobiphenyl as the compound (B), 0.50 g of 1,3,5-trihydroxybenzene as the compound (C) and 28 g of N,N-dimethylacetamide (hereinafter referred to as DMAc) were charged with stirring, the mixture was heated on an oil bath, and when the liquid temperature became 60° C., 3.0 g of potassium carbonate was quickly added, followed by heating at 60° C. for 4 hours with continuous stirring. Then, a solution having 0.85 g of 4-(4-fluorophenylethynyl)phenol as the compound (Y-1) dissolved in 6 g of DMAc, was added, followed by further heating at 60° C. for 5 hours.

Then, the reaction solution was cooled to room temperature and gradually put into about 200 mL of vigorously stirred 0.5 N aqueous hydrochloric acid solution, whereby a slightly brown powdery substance precipitated. This slightly brown powdery substance was collected by filtration and washed five times with pure water, followed by vacuum drying at 80° C. for 15 hours to obtain 3.4 g of a whitish gray powdery prepolymer. The obtained prepolymer had ether bonds and ethynyl groups as the crosslinkable functional groups (A), and its molecular weight was 9,000. A cured film formed by the above described method using the prepolymer had a relative permittivity of 2.6 and a birefringence of 0.002. By the DSC measurement, no transition point or no heat generation/heat absorption peak was observed, and Tg was at least 400° C. In the evaluation of the thick film forming property, defects such as cracks were not observed.

Example 2

Preparation of Prepolymer by the Method (ii) Using the Compounds (B), (C) and (Y-2)

Into a 100 mL pyrex (registered trademark) four-necked flask equipped with a Dimroth condenser, a thermocouple thermometer and a mechanical stirrer, 0.57 g of pentafluorophenylacetylene as the compound (Y-2), 0.71 g of 1,3,5-trihydroxybenzene as the compound (C) and 3.0 g of DMAc were charged. With stirring, the mixture was heated on an oil bath, and when the liquid temperature became 60° C., 0.4 g of potassium carbonate was quickly added, followed by heating at 60° C. for 5 hours with continuous stirring. Then, a solution having 3.00 g of perfluorobiphenyl as the compound (B) dissolved in 37.8 g of DMAc, was added, and then 3.1 g of potassium carbonate was added. The mixture was heated further at 60° C. for 17 hours.

Then, the reaction solution was cooled to room temperature and gradually put into about 200 mL of vigorously stirred 0.5 N aqueous hydrochloric acid solution, whereby a slightly brown powdery substance precipitated. This slightly brown powdery substance was collected by filtration and further washed twice with pure water followed by vacuum drying at 80° C. for 15 hours to obtain 3.5 g of a whitish gray powdery prepolymer. The obtained prepolymer had ether bonds and ethynyl groups. The same evaluation as in Example 1 was carried out, and results of evaluation of basic properties are shown in Table 1.

Example 3

Preparation of Prepolymer by the Method (ii) Using the Compounds (B), (C) and (Y-2)

A prepolymer powder was obtained in the same manner as in Example 2 except that 0.58 g of pentafluorostyrene was used instead of 0.57 g of pentafluorophenylacetylene as the compound (Y-2). The obtained prepolymer had ether bonds and vinyl groups. Evaluation was carried out in the same manner as in Example 1, and the results of the evaluation of the basic properties are shown in Table 1.

Example 4

Preparation of Prepolymer by the Method (ii) Using the Compounds (B), (C) and (Y-2)

Into a 50 mL two-necked flask equipped with a Dimroth condenser and a stirrer chip, 0.57 g of pentafluoroacetylene as the compound (Y-2), 0.75 g of 1,3,5-trihydroxybenzene as the compound (C), 3.00 g of perfluorobiphenyl as the compound (B) and 38.97 g of DMAc were charged. With stirring, the mixture was heated to 60° C. on an oil bath, and 3.72 g of potassium carbonate was quickly added, followed by heating at 60° C. for 22 hours with continuous stirring.

Then, the reaction solution was cooled to room temperature and gradually put into 150 mL of a vigorously stirred 0.5 N hydrochloric acid aqueous solution, whereby a slightly brown powdery substance precipitated. This slightly brown powdery substance was collected by filtration and washed twice with pure water, followed by vacuum drying at 80° C. for 12 hours to obtain 3.10 g of a whitish gray powdery prepolymer. The obtained prepolymer had ether bonds and ethynyl groups. Evaluation was carried out in the same manner as in Example 1, and the results of the evaluation of the basic properties are shown in Table 1.

Example 5

Preparation of Prepolymer by the Method (ii) Using the Compounds (B), (C) and (Y-2)

Into a 50 mL two-necked flask equipped with a Dimroth condenser and a stirrer chip, 1.15 g of pentafluorophenylacetylene as compound (Y-2), 0.65 g of 1,3,5-trihydroxybenzene as the compound (C), 2.00 g of perfluorobiphenyl as the compound (B) and 34.22 g of DMAc were charged. With stirring, the mixture was heated to 60° C. on an oil bath, and 3.23 g of potassium carbonate was quickly added, followed by heating at 60° C. for 22 hours with continuous stirring.

Then, the reaction solution was cooled to room temperature and gradually put into 150 mL of a vigorously stirred 0.5 N hydrochloric acid aqueous solution, whereby a slightly brown powdery substance precipitated. This slightly brown powdery substance was collected by filtration and washed twice with pure water, followed by vacuum drying at 80° C. for 12 hours to obtain 2.58 g of a whitish gray powdery prepolymer. The obtained prepolymer had ether bonds and ethynyl groups. Evaluation was carried out in the same manner as in Example 1, and the results of the evaluation of the basic properties are shown in Table 1.

Example 6

Preparation of Prepolymer by the Method (ii) Using the Compounds (B), (C) and (Y-2)

A prepolymer powder was obtained in the same manner as in Example 5 except that 1.83 g of 1,3,5-tris(4-hydroxyphenyl)benzene was used instead of 0.65 g of 1,3,5-trihydroxybenzene as the compound (C). The obtained prepolymer had ether bonds and ethynyl groups. Evaluation was carried out in the same manner as in Example 1, and the results of evaluation of the basic properties are shown in Table 1.

Example 7

Comparative Example: Preparation of Known Prepolymer

A 100 mL pyrex (registered trademark) four-necked flask equipped with a Dimroth condenser, a thermocouple thermometer and a mechanical stirrer, was flushed with nitrogen, and then, 2.51 g of perfluorobiphenyl, 1.68 g of dihydroxy-2,2-diphenylhexafluoropropane, 40 g of DMAc and 5 g of toluene were charged, and further, 1.66 g of potassium carbonate was charged. With stirring, the mixture was heated at 120° C. for 5 hours on an oil bath, and then, 0.7 g of potassium carbonate and 1.05 g of phenyl ethyl phenol were put, followed by further heating at 120° C. for 3 hours.

The reaction solution was cooled to room temperature and gradually put into 500 mL of a vigorously stirred mixed solution of pure water/methanol (volume ratio: about 1/1) containing 8 g of acetic acid, whereby a slightly brown powdery substance precipitated. This slightly brown powdery substance was collected by filtration and washed five times with pure water, followed by vacuum drying at 80° C. for 15 hours to obtain 4.2 g of a slightly brown powdery prepolymer. Evaluation was carried out in the same manner as in Example 1, and the results of the evaluation of the basic properties are shown in Table 1.

Example 8

Comparative Example: Preparation of Known Prepolymer

Into a 2 L pyrex (registered trademark) four-necked flask equipped with a Dimroth condenser, a thermocouple thermometer and a mechanical stirrer, 14.45 g of pentafluorophenylacetylene, 13.44 g of 1,3,5-trihydroxybenzene and 250.95 g of DMAc were charged. With stirring, the mixture was heated on an oil bath, and when the liquid temperature became 60° C., 10.39 g of potassium carbonate was quickly added, followed by heating at 60° C. for 2.5 hours with continuous stirring. Then, a solution having 79 g of perfluoro (1,3,5-triphenylbenzene) dissolved in 711 g of DMAc, was added, and then, 55.87 g of potassium carbonate was added, followed by further heating at 60° C. for 14.5 hours.

Then, the reaction solution was cooled to room temperature and gradually put into about 3 L of a vigorously stirred 0.5 N hydrochloric acid aqueous solution, whereby a white powdery substance precipitated. This white powdery substance was collected by filtration and washed three times with pure water, followed by vacuum drying at 80° C. for 15 hours to obtain 91.8 g of a white powdery prepolymer. The obtained prepolymer had ether bonds and ethynyl groups. Evaluation was carried out in the same manner as in Example 1, and the results of the evaluation of the basic properties are shown in Table 1.

Example 9

Comparative Example: Preparation of Known Prepolymer

In accordance with the method disclosed in Example 8 of JP-A-10-247646, a prepolymer was prepared from perfluorobiphenyl and 1,3,5-trihydroxybenzene. Evaluation was carried out in the same manner as in Example 1, and the results of the evaluation of the basic properties are shown in Table 1.

TABLE 1

| | Molecular weight | Relative permittivity | Birefringence | Tg (° C.) | Thick film-forming property |
|---|---|---|---|---|---|
| 1 | 9,000 | 2.6 | 0.002 | >400 | No defect |
| 2 | 4,000 | 2.5 | — | >400 | No defect |
| 3 | 4,000 | 2.4 | — | — | No defect |
| 4 | 8,300 | 2.4 | 0.001 | >400 | No defect |
| 5 | 3,300 | 2.5 | 0.001 | >400 | No defect |
| 6 | 4,000 | 2.6 | — | >400 | — |
| 7 Comparative | 5,100 | 2.8 | 0.008 | 295 | No defect |

TABLE 1-continued

|   | Molecular weight | Relative permittivity | Birefringence | Tg (° C.) | Thick film-forming property |
|---|---|---|---|---|---|
| 8 Comparative | 5,500 | 2.4 | 0.001 | >400 | Cracks observed |
| 9 Comparative | 10,000 | 2.5 | — | 220 | — |

From the results in Table 1, the prepolymers of the present invention were found to have a low permittivity, a low birefringence, high Tg and a thick film-forming property simultaneously and thus is useful for insulation films and optical materials.

Example 10

Adhesive Property of a Cured Film with a Substrate

A part of a 20% solution of the prepolymer obtained in Example 4 in cylohexanone (hereinafter referred to as the solution 4) was taken out and aminophenyltrimethoxysilane was added in an amount of 2 mass % based on the prepolymer to obtain a solution 4-1. Further, instead of aminophenyltrimethoxysilane, 3-aminopropyltriethoxysilane was added in an amount of 1 mass % based on the prepolymer to obtain a solution 4-2. Then, on silicon wafers, the solution 4, the solution 4-1 and the solution 4-2 were applied by spin coating to form wet films, followed by heating to prepare cured films.

The rotational speed of the spin coating was adjusted so that the wet film thickness became 500 nm, and after preliminary heating by a hot plate at 100° C. for 90 seconds and at 200° C. for 90 seconds, heating was carried out in a nitrogen atmosphere at 350° C. for two hours by a vertical furnace. These samples were subjected to a pressure cooker test (121° C., 100% RH, 4 hours) in a chamber supplied by ETAC, and then the adhesive properties of the cured films with the substrate were evaluated by the cross cut tape peel test as disclosed in JIS D0202.

At least 80% of cross cut sections of the cured film obtained from the solution 4 was peeled.

Whereas, no peeling was observed with respect to cross cut sections of the cured films obtained from the solutions 4-1 and 4-2.

From this Example, an adhesion promoter such as an aminosilane was found to be effective for the improvement of the adhesive property of the cured film.

Example 11

Preparation of a Cured Film Containing Pores

To the 20% solution of the prepolymer prepared in Example 5 in cyclohexanone, a poly(ε-caprolactone) having a number average molecular weight of 3,000 was added in an amount of 25 mass % based on the prepolymer and dissolved, followed by filtration by a PTFE filter (pore diameter: 0.2 μm) to obtain a uniform transparent solution (hereinafter referred to as the solution 5). The solution 5 was spin-coated on a 4-inch silicon wafer and then heated to form a cured film. The spinning conditions were 2,500 rpm for 30 seconds, and in the same manner as in Example 10, preheating was followed by heating. The cross section of the cured film was observed by SEM, whereby the presence of fine pores of nanometer order was confirmed. The relative permittivity of the cured film was 1.8. Further, no peeling by a cross cut tape peel test or no breakage of the film was observed.

Example 12

Evaluation as an Interlayer Insulation Film

From the solution 4, the solution 4-1 and the solution 5, a stack of films of a silicon wafer/p-SiO (300 nm)/prepolymer insulation film (500 nm)/p-SiN (50 nm)/p-SiO (500 nm) was prepared by the following method.

On a 4-inch silicon wafer having a p-SiO film (film thickness: 300 nm) formed, the solution was spin-coated to form a prepolymer insulation film having a thickness of 500 in the same manner as in Example 10. Then, by a mixed glass of monosilane, ammonia and nitrogen, a silicon nitride film was formed in a thickness of 50 nm, and then, by a mixed glass of monosilane and oxygen dinitride, a silicon oxide film having a thickness of 500 nm was formed.

The obtained stack was heated at 350° C. for 60 minutes in a nitrogen atmosphere, whereby the resistance against cracking due to heat stress was investigated by a metallographic microscope. The results are shown below.

With the stack formed from the solution 4, no formation of cracks or other defects was observed. With the stack formed from the solution 4-1, no formation of cracks or other defects was observed.

With the stack formed from the solution 5, no formation of cracks or other defects was observed.

From this Example, the prepolymer of the present invention was found to be easy for stacking with an inorganic film and thus is excellent in applicability as an interlayer insulation film.

Example 13

Preparation and Evaluation of a Prepolymer Film

A 40% solution of the prepolymer obtained in Example 4 in cyclohexanone was spin-coated on a silicon wafer, and then, after preheating by a hot plate at 100° C. for 180 seconds and at 200° C. for 180 seconds, heating was carried out in a nitrogen atmosphere at 300° C. for one hour by an oven.

From the silicon wafer, the cured film was peeled off to obtain a flexible slightly brown film having a thickness of 20 μm. By means of a TG-DTA apparatus manufactured by MacScience, TG (thermogravimetry) measurement was carried out in a nitrogen atmosphere at a temperature raising rate of 10° C./min, whereby a 5% weight reduction temperature of this film was about 470° C. By means of a moisture absorption/desorption measuring apparatus (IGASORP) manufactured by SiberHegner Company, Ltd., the moisture absorption was measured at 85° C. under a relative humidity of 85% and found to be 0.2%. A strip sample of 5 mm×15 mm was cut out, and by means of TMA apparatus manufactured by MacScience, the linear expansion coefficient from room temperature to 200° C. was measured under conditions of the tensile load being 5 g and the temperature raising rate being 10° C./min and was found to 55 ppm. From this Example, it was found possible to obtain a film having high heat resistance, low water absorption and a low thermal expansion coefficient by using the prepolymer of the present invention.

Example 14

Preparation of Prepolymer Using the Compounds (B), (C), (Y-1) and (Y-2)

Into a 50 mL two-necked flask equipped with a Dimroth condenser and a stirrer chip, 0.57 g of pentafluorophenylacetylene as the compound (Y-2), 0.75 g of 1,3,5-trihydroxybenzene as the compound (C), 3.00 g of perfluorobiphenyl as the compound (B) and 38.97 g of DMAc are charged. With stirring, the mixture is heated to 60° C. on an oil bath, and 3.72 g of potassium carbonate is quickly added, followed by heating at 60° C. for 18 hours with continuous stirring. Then, 0.35 g of 3-ethynylphenol is added as the compound (Y-1), and heating is further continued for 5 hours at 60° C.

Then, the reaction solution is cooled to room temperature and gradually put into 150 mL of vigorously stirred 0.5 N nitric acid aqueous solution, whereby a precipitate of a slightly brown powdery substance is formed. This precipitate is collected by filtration and washed twice with pure water, followed by vacuum drying at 80° C. to obtain a whitish gray powdery prepolymer. Using the obtained prepolymer, the basic properties are evaluated in the same manner as in Example 1, whereby substantially the same results as in Example 1 are obtained.

The entire disclosure of Japanese Patent Application No. 2003-340031 filed on Sep. 30, 2003 including specification, claims and summary is incorporated herein by reference in its entirety.

What is claimed is:

1. A crosslinkable fluorinated aromatic prepolymer which is obtained by reacting starting materials in a condensation reaction in the presence of a HF-removing agent, wherein the starting materials are (1), (2) and (3):
   (1) either one or both of a compound (Y-1) having a crosslinkable functional group (A) and one or two phenolic hydroxyl groups; and a compound (Y-2) having a crosslinkable functional group (A) and a fluorinated aromatic ring, and
   (2) a fluorinated aromatic compound (B) represented by the following formula (1):

(1)

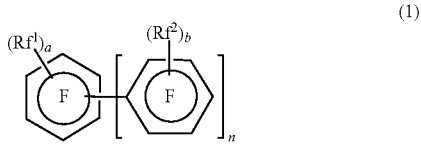

wherein n is an integer ranging from 0 to 2, each of a and b which are independent of each other, is an integer ranging from 0 to 3, and each of $Rf^1$ and $Rf^2$ which may be the same or different from each other, represents a fluorinated alkyl group having at most 8 carbon atoms, and F in the aromatic ring indicates that the ring hydrogen atoms are all substituted by fluorine atoms), and
   (3) a compound (C) having at least 3 phenolic hydroxyl groups and which has crosslinkable functional groups (A) and ether bonds and has a number average molecular weight of from $1 \times 10^3$ to $5 \times 10^5$ wherein (C) is selected from the group consisting of 1,3, 5-trihydroxybenzene, trihydroxybiphenyl, trihydroxynaphthalene, 1,1,1-tris(4- hydroxyphenyl)ethane, tris(4-hydroxyphenyl)benzene, tetrahydroxybenzene, tetrahydroxybiphenyl, tetrahydroxybinaphthyl and tetrahydroxyspiroindan.

2. The crosslinkable fluorinated aromatic prepolymer according to claim 1, wherein the crosslinkable functional group (A) is an ethynyl group.

3. A cured product formed by curing the crosslinkable fluorinated aromatic prepolymer as defined in claim 1.

4. A coating composition comprising the crosslinkable fluorinated aromatic prepolymer as defined in claim 1, and a solvent.

5. A cured film formed by a process, comprising:
   forming a wet film of a crosslinkable fluorinated aromatic prepolymer by the application of the coating composition as defined in claim 3 on a substrate, and then
   after removing the solvent in the wet film or at the same time as the removal of the solvent, curing the crosslinkable fluorinated aromatic prepolymer.

6. The cured film according to claim 5, which is porous.

7. An electric or electronic component having the cured film as defined in claim 5 as a component.

8. The crosslinkable fluorinated aromatic prepolymer according to claim 1, wherein the groups $Rf^1$ and $Rf^2$ are each selected from the group consisting of perfluoromethyl, perfluoroethyl, perfluoropropyl, perfluorobutyl, perfluorohexyl and perfluorooctyl.

9. The crosslinkable fluorinated aromatic prepolymer according to claim 1, wherein the HF removing agent is sodium carbonate, potassium carbonate, sodium hydrogen carbonate, potassium hydrogen carbonate, sodium hydroxide or potassium hydroxide.

10. The crosslinkable fluorinated aromatic prepolymer according to claim 1, wherein compound (C) is 1,3,5-trihydroxybenzene, 1,1,1-tris(4-hydroxyphenyl)ethane or tris(4-hydroxyphenyl)benzene.

11. The crosslinkable fluorinated aromatic prepolymer according to claim 1, wherein the crosslinkable functional group (A) is a vinyl group, an allyl group, a methacryloyl (oxy) group, an acryloyl(oxy) group, a vinyloxy group, a trifluorovinyl group, trifluorovinyloxy group, an ethynyl group, a 1-oxocyclopenta-2,5-diene-3-yl group, a cyano group, an alkoxysilyl group, a diarylhydroxpnethyl group or a hydroxylfluorenyl group.

12. The crosslinkable fluorinated aromatic prepolymer according to claim 1, wherein n is a value of 0 or 1.

13. The crosslinkable fluorinated aromatic prepolymer according to claim 1, comprising Y-1 which is 2,2'-bis(phenylethynyl)-4,4'-dihydroxybiphenyl.

14. The crosslinkable fluorinated aromatic prepolymer according to claim 1, comprising Y-1 which is 2,2'-bis(phenylethynyl)-5,5'-dihydroxybiphenyl.

15. The crosslinkable fluorinated aromatic prepolymer according to claim 1, comprising Y-1 which is 4,4'-dihydroxytolan or 3,3'-dihydroxytolan.

16. The crosslinkable fluorinated aromatic prepolymer according to claim 1, wherein the starting materials consist of (1), (2) and (3).

* * * * *